United States Patent

Mizuno

[11] Patent Number: 5,777,327
[45] Date of Patent: Jul. 7, 1998

[54] PATTERN SHAPE INSPECTION APPARATUS FOR FORMING SPECIMEN IMAGE ON DISPLAY APPARATUS

[75] Inventor: Fumio Mizuno, Tokorozawa, Japan

[73] Assignee: Hitachi, Ltd., Tokyo, Japan

[21] Appl. No.: 771,748

[22] Filed: Dec. 20, 1996

[30] Foreign Application Priority Data

Dec. 28, 1995 [JP] Japan .................. 7-343083

[51] Int. Cl.[6] .................................. H01J 37/00
[52] U.S. Cl. .................................. 250/310; 250/306
[58] Field of Search .................. 250/310, 306, 250/307; 324/751

[56] References Cited

U.S. PATENT DOCUMENTS

| | | | |
|---|---|---|---|
| 4,039,829 | 8/1977 | Kato et al. | 250/310 |
| 4,575,630 | 3/1986 | Lukianoff | 250/310 |
| 4,777,364 | 10/1988 | Sartore | 250/307 |
| 5,521,517 | 5/1996 | Shida et al. | 250/310 |

FOREIGN PATENT DOCUMENTS 59-160948A  9/1984  Japan.

*Primary Examiner*—Kiet T. Nguyen
*Attorney, Agent, or Firm*—Kenyon & Kenyon

[57] ABSTRACT

A pattern shape inspection apparatus for displaying a specimen image on a display apparatus, and inspecting a pattern shape of the specimen image includes a memory for memorizing a reference image corresponding to an observation region and a display for simultaneously displaying the reference image and the specimen image. At least one of the image parameters of the specimen image and the reference image is corrected to aid in the comparison.

9 Claims, 4 Drawing Sheets

PATTERN SHAPE INSPECTION APPARATUS FOR FORMING SPECIMEN IMAGE ON DISPLAY APPARATUS

BACKGROUND OF THE INVENTION

The present invention relates to a pattern inspection apparatus for inspecting a pattern by forming an image and then observing the image with a scanning electronic microscope using a scanning probe.

In the conventional semiconductor fabrication process, a scanning electronic microscope (SEM) is often used for inspecting the shape of a pattern formed on a wafer.

In a conventional method for inspecting the pattern shape by a wafer inspection SEM, forming the SEM image with respect to a inspection point on the wafer, requires inspection operator to observe the SEM image manually and judge the existence of defective points by relying upon his/her knowledge and information.

As the conventional pattern shape inspection method is based upon the inspection operator's judgment, the judgment criteria is not clarified and the judgment accuracy depends on the inspection operator's experience and expertise, and requires a long time for the inspection and the inspection result do not yield satisfactory certainty.

SUMMARY OF THE INVENTION

The present invention is to provide a pattern shape inspection apparatus for solving the above mentioned problems in the prior art and for accurately detecting the defective points in the pattern shape in a shorter period of time.

In the present invention, by displaying the specimen image generated in real time and a previously prepared reference image the same display screen simultaneously, the judgment criteria for the specimen image can be interpreted by the reference image, which enables the accurate and swift judgment of the defective points.

The pattern shape inspection apparatus of the present invention for inspecting the pattern shape formed on the specimen by displaying the specimen image on the display screen comprises a means for storing the reference image corresponding to the observation region and a means for displaying the reference image and the specimen image on a single display screen for observation purposes at the same time. For comparing the specimen image and the reference image, a bit map subtraction image located between the specimen image and the reference image may be displayed.

The pattern shape inspection apparatus of the present invention for inspecting the pattern shape formed on the specimen by displaying the specimen image on the display screen comprises a means for storing a recipe describing the information for performing the inspection operation, a means for performing the inspection operation in a full-automatic manner or in a semi-automatic manner by using the information described in the recipe, a means for reading out the inspection point map defined in the recipe and displaying the map on the display apparatus, a means for selecting the inspection point on the inspection point map, a means for focusing the specimen observation point onto the selected inspection point, a means for storing the reference images corresponding to the individual inspection points, a means for displaying the specimen image on the selected inspection point and the reference image corresponding to the inspection point on the display means, and a means for writing the inspection result over the inspection point map.

It is preferable that image parameters for the specimen image and the reference image such as brightness, saturation and contrast can be independently modified in order to enable the comparison between the specimen image and the reference image in higher degree of accuracy within a practical specified tolerance even in cases where there exist differences in specimen preparation conditions.

A pattern shape inspection can be performed automatically with a means for comparing the specimen image and the reference image, a means for storing the judgment criteria for defects in the pattern shape, a means for judging the existence of defects on the pattern in the specimen image based on the judgment criteria for defects, and a means for reporting the existence of defects on the pattern.

DETAILED DESCRIPTION

Embodiments of the present invention will be described by referring to the accompanying drawings. Though what is examplified in the following embodiments is a case where the shape of the pattern formed on the wafer is examined by using a wafer inspection SEM, the scope of the present invention is not limited to these embodiments.

Figure 1:
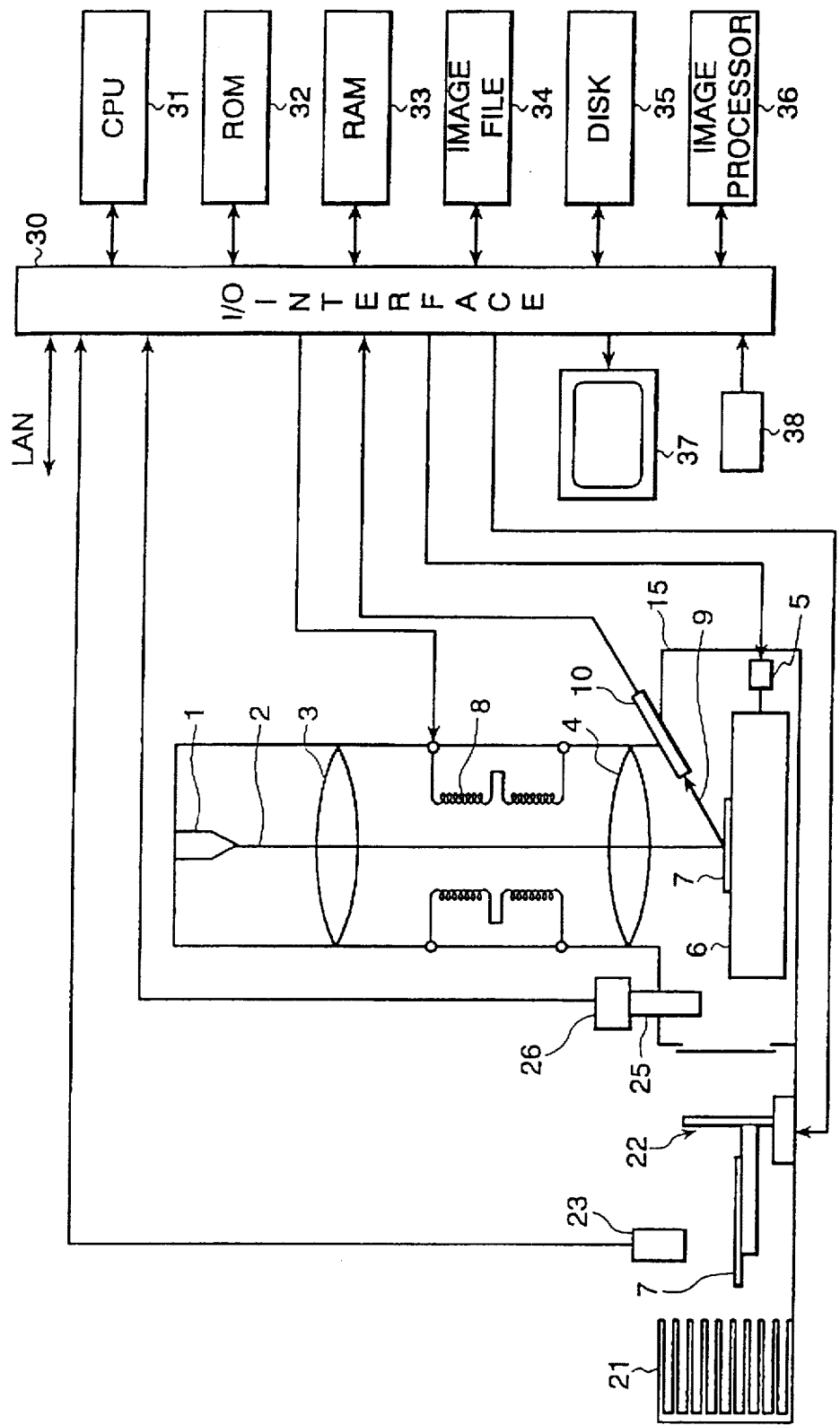
FIG. 1 shows a shematic view of the pattern inspection procedure in the present invention.

FIG. 1 shows a schematic structural diagram of one embodiment of the pattern shape inspection apparatus of the present invention.

The wafer 7 to be inspected is mounted on a wafer carrier 21, and a wafer carry means 22 picks up a single wafer 7 from the wafer carrier 21 and loads the wafer 7 on an XY stage 6 in a specimen chamber 15. The alignment of the wafer 7 is preliminary adjusted with reference to the orientation flat and the notch, and at the same time, a wafer identification number marked on the wafer 7 is read out by a wafer identification number reader 23. The XY stage 6 in the specimen chamber 15 can be moved in two dimensional directions by a drive motor 5. An optical microscope 25 and an imaging apparatus 26 used for detecting the alignment pattern on the wafer 7 are mounted in the specimen 15.

An electron beam 2 emitted from an electron gun 1 is orificed and focused by a focus lens 3 and an object lens 4, and develops a focus point on the surface of the wafer 7 mounted on the XY stage 6 movable in two dimensional directions by the drive motor 5. At the same time, the electron beam 2 is deflected by a deflector 8 so as to scan the surface of the wafer 7 in two dimensional directions. Secondary electrons 9 are emitted from the part on the wafer 1 exposed by the electron beam 2. The secondary electrons 9 are detected by a secondary electron sensor 10. The output signal from the secondary electron sensor 10 is processed for A/D conversion and forwarded to an I/O interface 30 for an input to the arithmetic and control unit 31 such as CPU. The signal generated by the secondary electrons is synchronized with the scanning signal supplied to the deflector 8 and used as the brightness modulation signal for a CRT display 37, and then, the specimen image (SEM image) is displayed on display screen 40.

Memories such as ROM 32 and ROM 33 for storing programs and constant data, image file 34 for storing the reference image to be described later, storage apparatus 35 such as magnetic disks and magnetic optical disks, image processor 36 controlled by CPU31, the display 37 such as CRT, and input means 38 such as keyboard and mouse are connected to the I/O interface 30. The data captured by the wafer identification number reader 23 and the image data of the imaging apparatus 26 are processed for the A/D conversion and captured into CPU 31 through the I/O interface. The deflector 8 of the SEM, the stage driving motor 5 and the wafer carrying means 22 are controlled by CPU 31.

Figure 2:
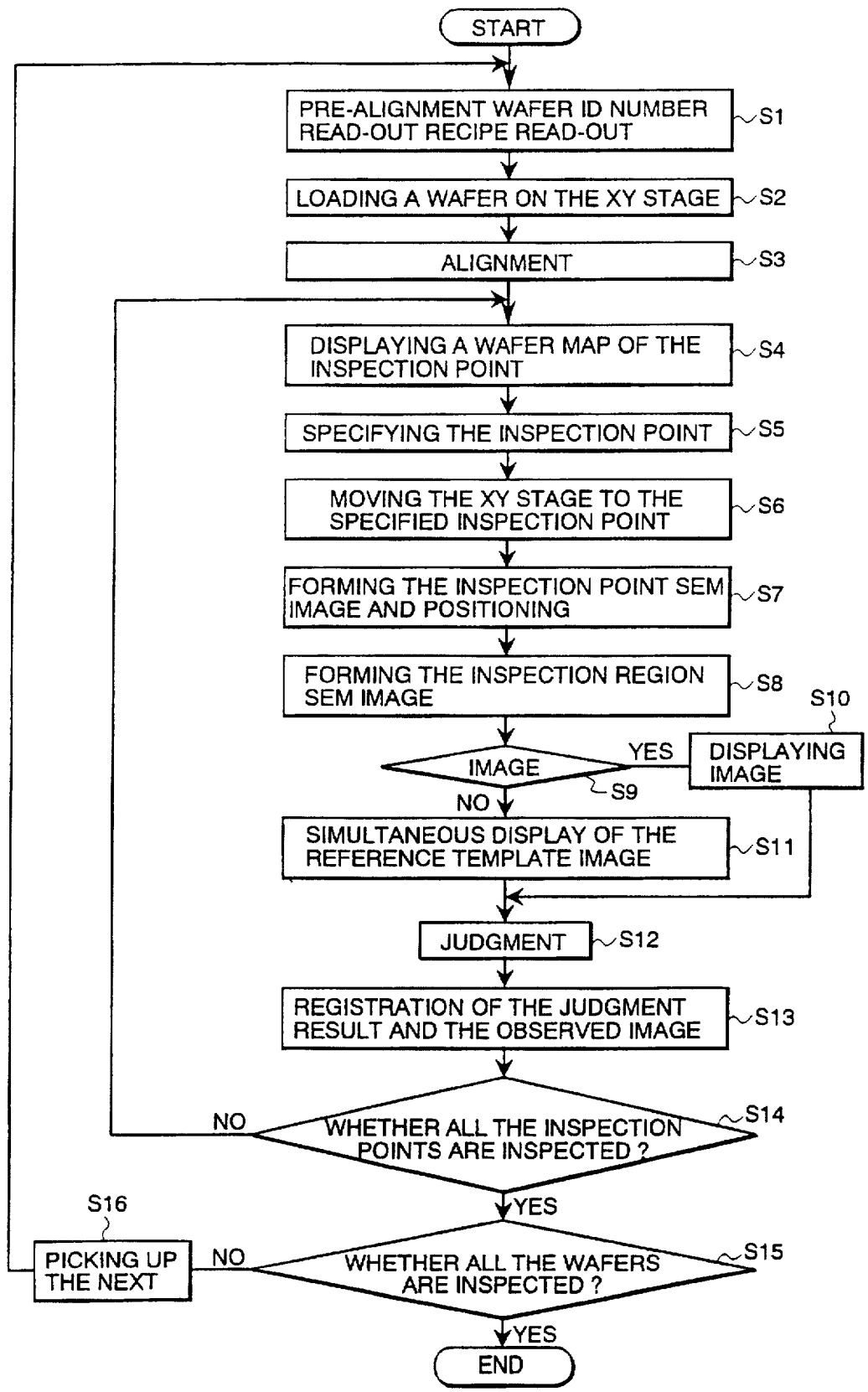
FIG. 2 shows an inspection flow in the present invention.

Next, an example of the operational procedure is described by referring to FIG. 2.

The inspected wafer 7 picked up from the wafer carrier 21 is loaded on the XY stage 6 in the specimen chamber 15 by the wafer carrying means 22. The alignment of the wafer 7 is preliminary adjusted with reference to the orientation flat and the notch, and at the same time, the wafer 7 identification number marked on the wafer is read out by the wafer identification number reader 23 (in Step S1). The wafer identification number is generic to the individual wafer, and the recipe stored in the memory means 35 in advance is read out by referring to the readout wafer identification number as a key. The recipe stored is prepared for the individual wafer 7, which defines the data regarding the inspection procedure and the inspection conditions required for the inspection operation such as SEM operational conditions including voltage, current and magnification rate, the positions of the inspection points on the wafer and the alignment pattern, the address of the reference image stored in the image file 34, the criteria (threshold value) for the damage and defect judgment, and the display method of the judgment result. The operational procedure thereafter is performed in a semi-automatic manner in accordance with the specified recipe.

After the wafer identification number is read in, the wafer 7 is carried into the specimen chamber 15 which is kept in a vacuum condition and loaded on the XY stage 6 in the specimen chamber 15 (in Step S2).

The alignment of the wafer 7 loaded on the XY stage 6 is adjusted by using the optical microscope 25 and the imaging apparatus 26 installed on the upper ceiling of the specimen chamber 15 (in Step S3). In the alignment operation, at first, the alignment pattern formed on the wafer 7 is positioned at the place just under the optical microscope 25 by moving the XY stage 6 with the driving motor 5 with reference to the coordinate data of the alignment pattern described in the recipe, and next, the optical microscopic image of the alignment pattern, magnified in several hundred times with respect to the original pattern size, is captured by the imaging apparatus 26 and supplied to the image processor 36. The image processor 36 detects the alignment pattern by the image processing such as outline detection.

Next, a reference image for the alignment pattern stored in accompanying with the recipe is read out from the image file 34, and the detected alignment pattern and the template are compared. The alignment operation for the wafer 7 is performed by adjusting the position of the XY stage 6 by the driving motor 5 so that the images of the detected alignment pattern and the template may be exactly overlaid on each other. The overlaying operation of the images are performed automatically by the image processor 36, and the process of the overlaying operation may be displayed on the display apparatus 37, if necessary.

Figure 3:
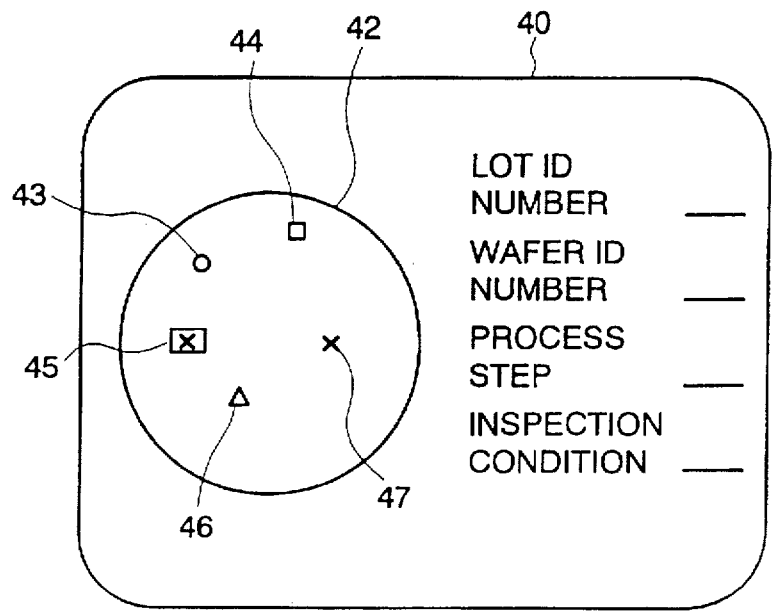
FIG. 3 shows an example of a wafer map shown in the display apparatus in the present invention.

After the alignment operation, a wafer map corresponding to the inspected wafer is read out and displayed on the display apparatus 37 (in Step S4). FIG. 3 shows an example of the wafer map displayed on the display screen 40 of the display apparatus 37. A wafer map represents graphically the positions of the designated inspection points 43 to 47 within the boundary line 42 showing the shape of the wafer 1. The lot number of the wafer 1, the wafer identification number, the current process step and the history of the inspection results performed are displayed in terms of characters and symbols beside the wafer map. The inspection points with their inspection procedures being completed are displayed with symbols like a square frame, for example, as shown in the inspection point 45, so as to be distinguished from the inspection points with their inspection procedures not completed yet.

Figure 4:
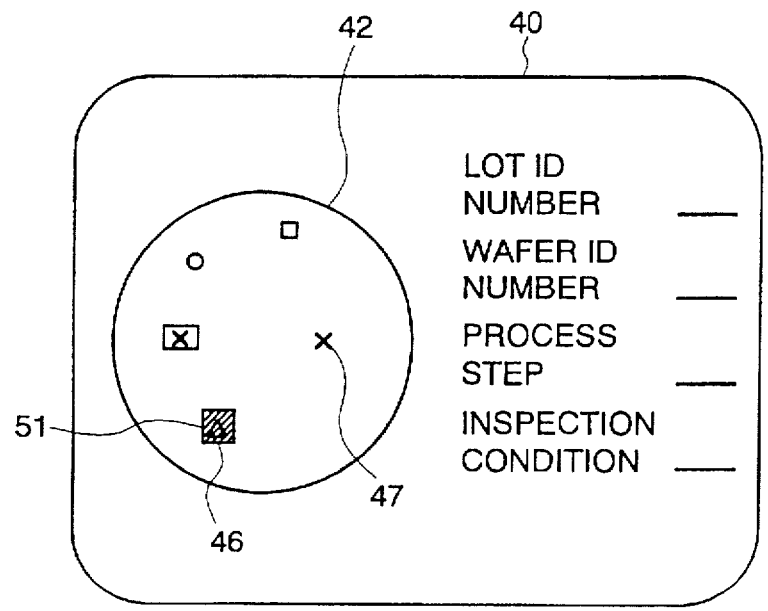
FIG. 4 shows another example of the wafer map shown in the display apparatus in the present invention.

Now that the wafer map is displayed on the display screen 40, the inspection operator is allowed to select the point to be inspected among the points with their inspection procedures not completed yet, which is realized by clicking the object representing the inspection point on the screen 40 with such a pointing device as mouse. The selected inspection point 46 is marked with an identification symbol 51 characterized by blinking display property or distinguished coloring on the wafer map as shown in FIG. 4.

After completing the inspection point selection, the wafer 7 is moved with the XY stage 6 so that the target inspection point may be fixed at the position just under the electronic beam 2 (in step S6). This movement of the XY stage 6 is performed by controlling the driving motor 5 with reference to the coordinate position of the target inspection point described in the recipe.

After the XY stage 6 is so moved as to fix the target inspection point at the electron beam target, the scanning electron beam is exposed onto the target inspection point, and the SEM image is formed with a relatively low magnification rate. An alignment operation is performed by using this low magnification rate SEM image (in Step S7). In the alignment operation in Step S7, similarly to the alignment operation in Step S3, a reference image stored in advance for the SEM image corresponding to the target inspection point is read out from the image file 34, and the low magnification rate SEM image and the reference image are just overlaid to each other, which means that the field of views of both images are exactly overlaid. In this alignment operation, a stepwise adjustment can be performed with the magnification rate increased step by step. In this stepwise method, the reference image for the SEM image corresponding to the specified magnification rate is read out from the image file 34 and used for the alignment operation. Thus, the target inspection point on the inspected wafer is finally positioned accurately at the inspection site. In the inspection point alignment under the higher magnification rate, the fine adjustment of the scanning region of the electron beam 2 is preferable rather than the direct movement of the XY stage 6.

The inspection region on the inspected wafer 7 positioned at the designated inspection site is located at the center of the display, that is, at the target of the electron beam 2. In this condition, the high magnification rate SEM image of the inspected region on the wafer is formed (in Step S8). Next, in response to the description of the recipe (in Step S9), in case that the selected inspection region is a region for image comparison, the subtraction image 53 between the observed SEM image of the inspected region and the reference image is displayed as shown in FIG. 5 (in Step S10), and otherwise, the high magnification rate SEM image 55 of the inspected region 46 and the high magnification rate image of the reference image stored in accompanying with the recipe corresponding to the inspected region 46 are displayed side by side (in Step S11).

Figure 5:
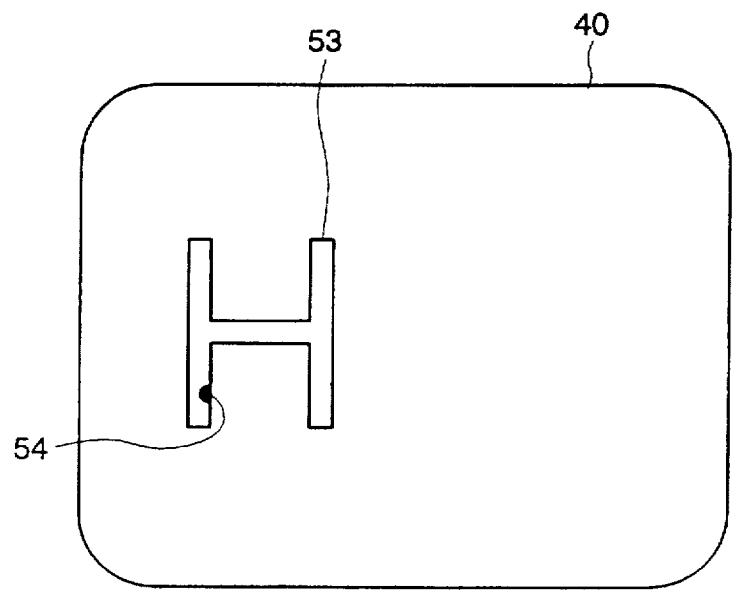
FIG. 5 shows an example for displaying a subtraction image between an observed SEM image in an inspected region and a reference SEM image on the display apparatus.
Figure 6:
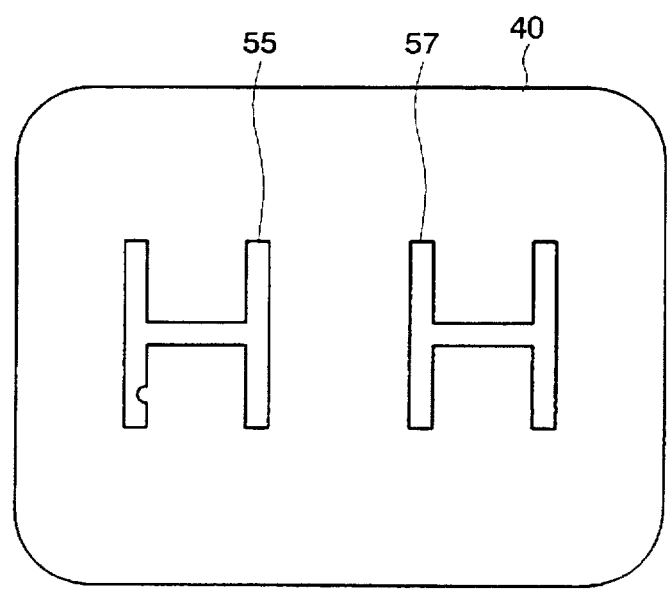
FIG. 6 shows an example for displaying both of the observed SEM image in the inspected region and the reference SEM image on the display apparatus.

The recipe defines what inspected region should be processed in Step S10 for displaying the subtraction image 53 between the observed SEM image of the inspected region and the reference image (as shown in FIG. 5), and also what inspected region should be processed in Step S11 for displaying side by side the high magnification rate SEM image 55 and the high magnification rate image of the reference image 57, both corresponding to the inspected region.

In case that the contrast of the image is high and the damage and/or defect on the wafer can be immediately found in the automatic inspection, the Step S10 should be selected. Unfortunately, in case of a pattern containing gray level images which makes it difficult to extract outlines, in forming a subtracted image between the high magnification rate SEM image and the reference image, both corresponding to the inspected region as shown in FIG. 5, there may be a case that the observed SEM image and the template can not be matched exactly even if the generic pattern on the wafer does not contain any damage or defect and the thickness error of the thin film layer on the wafer could be allowed within a reasonable manufacturing tolerance. Thus, even if the comparison result reports that the observed SEM image and the template of the inspected region does not exactly match to each other, whether this is caused by the damage and/or defect in the generic pattern on the wafer or this is caused by the image processing conditions can not be straightforwardly concluded. In the overlaying process, the observed SEM image may be processed by the image processor 36 for extracting outlines. In addition, in order to make it easier to compare the observed image and the template and judge the difference between them, for example, it is allowed to modify independently image parameters such as the brightness, saturation and contrast of those images, and to bring such a visual effect that the different portion 54 between the observed image and the template is marked in a distinguished color, for example, red.

In such a case, Step S11 is selected next after Step 9. In Step 11, in case that optical microscopic images and/or focused ion beam images in accompanying with the recipes corresponding to the individual inspected regions are stored in the file, those filed images may be read out from the image file 34 and used as the reference images to be displayed simultaneously on the display screen. This is because more definite judgment can be established by referring to the reference images prepared by another imaging processes other than SEM imaging procedures.

The inspection operator observes the substracted image between the observed SEM image and the template image or both images displayed simultaneously on the display screen 40 in Step S10 or S11, and judges the existence of the damage and/or defect in the pattern in the inspected region on the wafer 1 (in Step S12).

After completing the damage and/or defect judgment of the designated inspected point, the wafer map is displayed on the display screen again. The judgment result is displayed on the designated inspected point with its judgment completed in the wafer map. The display of the judgment result can be recognized more easily by altering the display colors for marking the inspected points on the wafer map in response to the inspection result whether extraordinary or not. If necessary, the observed SEM image is filed and stored (in Step 13). The observed SEM image stored in the image file 34 can be referred as the referenced reference image in the subsequent inspection process.

In the above described steps, the pattern shape inspection for a single inspection point is completed. If there still remains any inspection point to be inspected (in Step S14), going back to Step 4, a newly inspected point is specified on the wafer map and the above described steps are repeated again. When all the inspection processes for the inspected points are completed, the inspection operation for a single wafer is completed. In case that there will remain any wafer on the wafer carrier with its inspection not yet completed (in Step S15), the next wafer is picked up (in Step S16) and the inspection procedures from Step 1 is repeated again.

In the above embodiment, what is described is an inspection operation in which the inspection point displayed on the wafer map is specified explicitly and interactively by the inspection operator. It is allowed to automate the inspection operation by moving the XY stage 6 to the next inspection point designated by the recipe after completing the pattern shape inspection for one inspection point. In case of selecting Step S10, it may be allowed to make the judgment to be done in Step S12 performed automatically based on the judgment condition defined in the recipe, and to report the inspection result to the inspection operator with an alarm signal or message only when the damage and/or defect is observed.

As shown in the description of Step S13, the reference image can be newly registered or revised along with the inspection operation going on. In the above embodiment, it is assumed that all of the reference images are stored before the inspection operation begins. It may be allowed that the images of the identical pattern on the adjacent chips or cells on the wafer under inspection is used for revising the original reference image along with the inspection operation, in case that the brightness and/or contrast of the images in the original reference image is much different from the brightness and/or contrast of the observed SEM images due to the wafer processing conditions.

In case that the charged particle beams such as electron beams and ion beams are used for forming patterns on the insulation substrate, in which it takes relatively a long time to charge up and saturate the specimen by exposing the charged particle beams, it is preferable to capture the observed image after exposing the charged particle beam in a designated period of time. The designated period of time for waiting until capturing the observed image can be described in the recipe in advance.

As for the simultaneous display of the observed SEM image and the image of the reference image, it is allowed to use separate display screens for the individual images, respectively, in stead of displaying those images on separated frames on a single display screen. Plural reference images may be prepared for representing the upper bound and the lower bound for the damage and/or defect judgment criteria. In the alignment operation of the wafer for searching the target inspected points, it is allowed to search the target inspection point directly by referring to the high magnification rate SEM image, and to search the neighboring area of the target inspect point with lower magnification rate if the search with higher magnification rate is failed. Using an XYT stage instead of the XY stage, a pattern shape 6 inspection in which the specimen is tilted with respect to the SEM beam axis is enabled.

In the above embodiment, what is described is a case that the shape of the process pattern in the target inspection object is known in advance. However, it is possible to extend the class of the inspection object to those shaped in indefinite geometry due to attached foreign substances and like, and to display plural images for the reference images in order to identify foreign substances based on the similarity in the pattern shapes of the observed image and the reference image. In addition, it is allowed to make the inspection apparatus accompanying with the analysis apparatus such as characteristic X-ray analyzer and Auger electron spectroscopy analyzer in order to obtain the analysis data of the damage and/or defect portion and understand their composition and structural characteristics, in case that the pattern shape is proved to include any damage and/or defect.

In the above embodiment, what is described is an example using an electron beam for forming the image. The present invention can be applied to the cases that ion beams, optical beams and mechanical probes are used, and the inspection method forming the images with multi-probes and/or multi-pixels. It is also possible to handle the images formed by the static image capturing optical systems instead of scanning images.

I claim:

1. A pattern shape inspection apparatus for displaying a specimen image on a display apparatus, and inspecting a pattern shape of said specimen image, comprising:

a memory for memorizing a reference image corresponding to an observation region;

a display for simultaneously displaying said reference image and said specimen image on said display apparatus; and a correcting means for correcting an image parameter of at least one of said specimen image and said reference image.

2. The pattern shape inspection apparatus as defined in claim 1, wherein said image parameter is at least one of brightness, saturation and contrast.

3. The pattern shape inspection apparatus as defined in claim 1, wherein said memory memorizes said specimen image as said reference image.

4. The pattern shape inspection apparatus as defined in claim 1, further comprising:

a means for forming said specimen image using a probe after exposing a charged particle in a previously designated time.

5. A pattern shape inspection apparatus for displaying a specimen image on a display apparatus, and inspecting a pattern shape of said specimen image, comprising:

a means for storing a recipe defining information for performing an inspection operation;

a means for performing an inspection operation automatically or semi-automatically by using information described in said recipe;

a means for reading out an inspection map described in said recipe and displaying said inspection map on said display apparatus;

a means for selecting an inspection point in said inspection point map;

a means for moving a specimen observation position to said selected inspection point;

a means for storing a reference image corresponding to said individual selected inspection point;

a means for simultaneously displaying a specimen image of said selected inspection point and said reference image corresponding to said inspection point on said display means;

a correcting means for correcting an image parameter of at least one of said specimen image and said reference image: and a means for writing an inspection result on said inspection point map.

6. The pattern shape inspection apparatus as defined in claim 5, wherein said image parameter is at least one of brightness, saturation and contrast.

7. The pattern shape inspection apparatus of claim 6, further comprising:

a means for collating said specimen image and said reference image;

a memory for memorizing a judgment criteria for an extraordinary structure in said pattern shape;

a judging means for judging an existence of an extraordinary pattern in a specimen image based on said judgment criteria; and a reporting means for reporting a status of detecting an extraordinary pattern shape when an extraordinary pattern is detected.

8. The pattern shape inspection apparatus as defined in claim 5, wherein said memory for memorizing said reference image memorizes said specimen image as said reference image.

9. The pattern shape inspection apparatus as defined in claim 5, further comprising:

a means for forming a specimen image defined by a probe after exposing said probe in a designated period of time.

* * * * *